United States Patent [19]

Riblet

[11] Patent Number: 4,489,271
[45] Date of Patent: Dec. 18, 1984

[54] REFLECTION COEFFICIENT MEASUREMENTS

[76] Inventor: Gordon P. Riblet, 116 Westgate Rd., Wellesley, Mass. 02181

[21] Appl. No.: 221,005

[22] Filed: Dec. 29, 1980

Related U.S. Application Data

[63] Continuation-in-part of Ser. No. 3,497, Jan. 15, 1979, abandoned.

[51] Int. Cl.³ .................. G01R 27/04; H01P 5/12; G01B 9/02
[52] U.S. Cl. .................. 324/58 B; 333/114; 333/116; 356/345
[58] Field of Search .......... 324/58 B, 58 A, 58 R, 324/95; 333/109, 114, 116; 356/345

[56] References Cited

U.S. PATENT DOCUMENTS 2,654,863 10/1953 Riblet .................. 324/58 B

OTHER PUBLICATIONS

Riblet, H. J.; "A Swept-Frequency . . . "; Proc. of the IRE; Dec. 1948; pp. 1493-1499.

Primary Examiner—Ernest F. Karlsen
Attorney, Agent, or Firm—Wolf, Greenfield & Sacks

[57] ABSTRACT

A compact apparatus for the accurate measurement of complex reflection coefficients and VSWR of a device over either a waveguide bandwidth or multi-octave bandwidth by preferably measuring two power levels at detectors associated with the device. The device is formed by a main coupling means which in one embodiment is a main guide arm having means for receiving a test signal and means for transmitting the signal to the device being measured. In addition to the main coupling means (arms) there are also provided detector arms each having a detector associated therewith and means coupling signals from the main arm to the detector arms with the overall design being controlled in accordance with relatively simple formulae. The techniques of the invention are embodied herein in a waveguide embodiment, a stripline embodiment and a quasi-optical embodiment of the invention.

28 Claims, 19 Drawing Figures

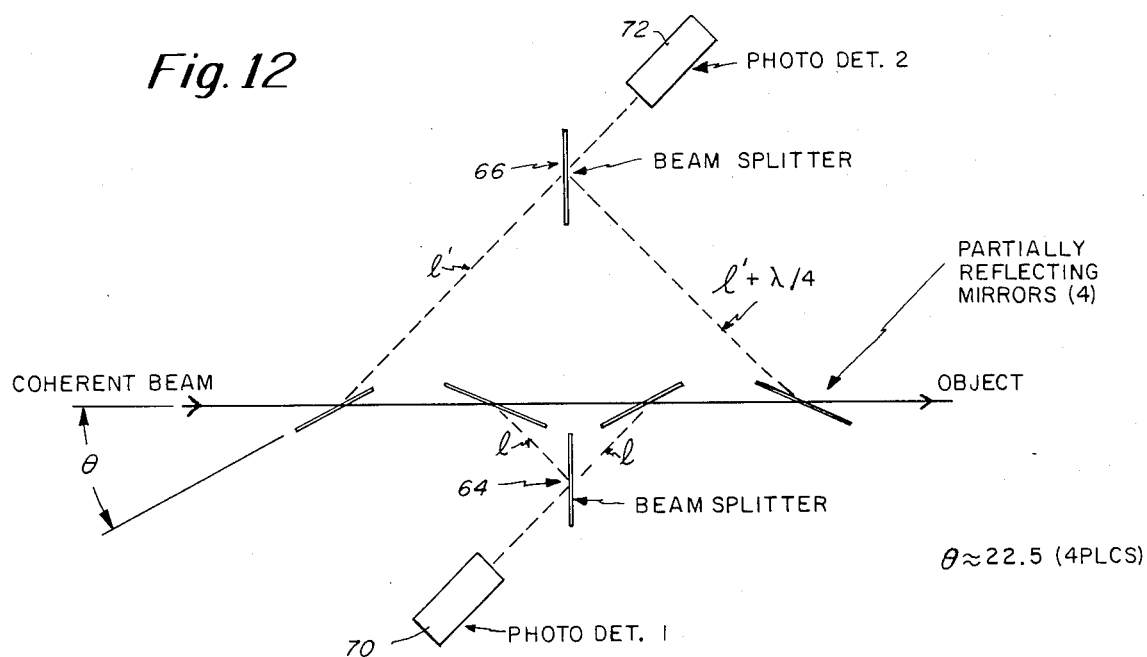
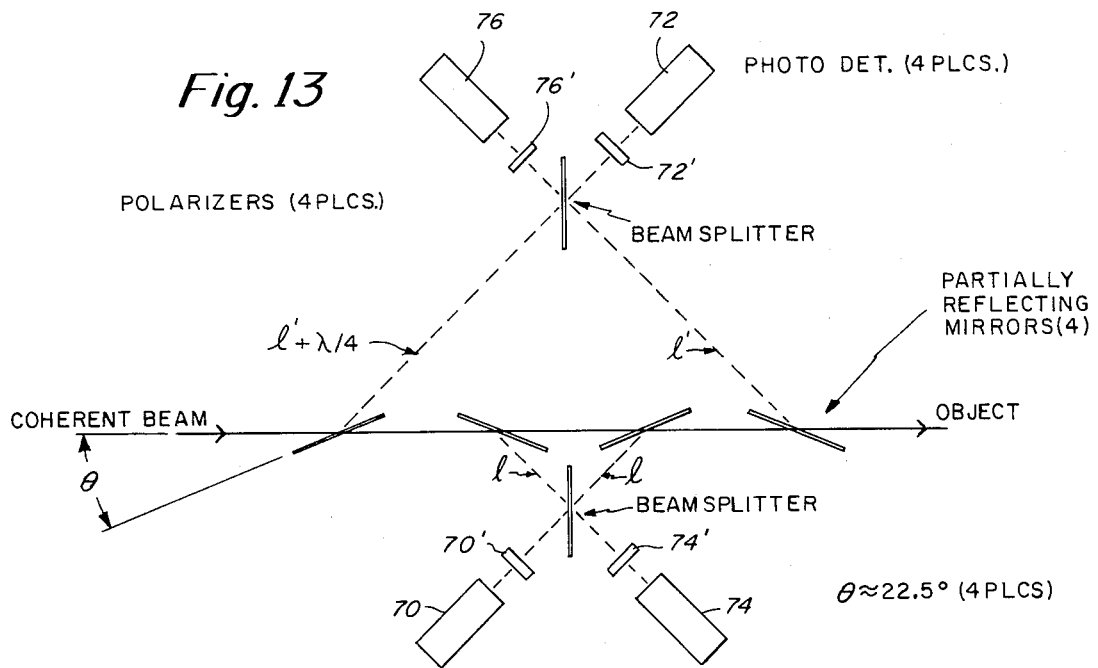

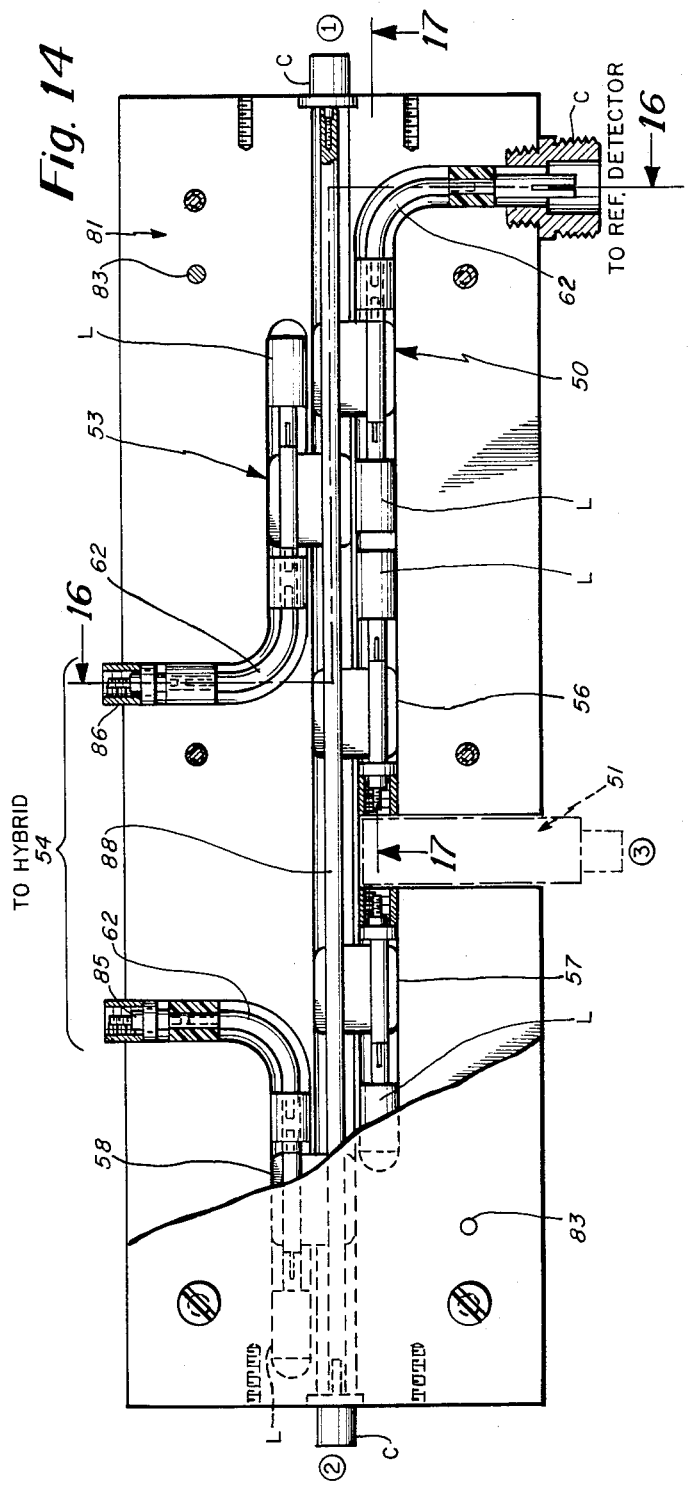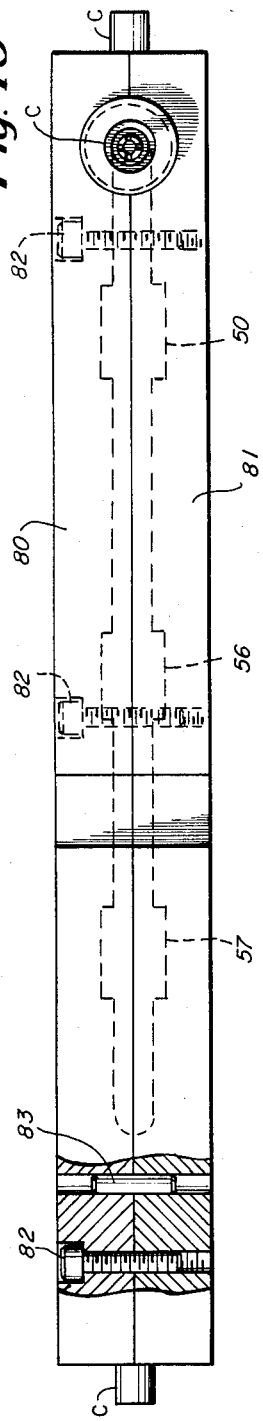

REFLECTION COEFFICIENT MEASUREMENTS

RELATED APPLICATION

This is a continuation-in-part of application Ser. No. 003,497 filed Jan. 15, 1979, now abandoned.

BACKGROUND OF THE INVENTION

The present invention relates in general to a device for the accurate and rapid measurement of complex reflection coefficients by the measuremet of power levels at two detectors. The device described herein is constructed in a compact arrangement in either stripline or waveguide. The device of this invention provides for the accurate and rapid measurement of complex reflection coefficients and, more particularly, the accurate measurements of low voltage standing wave ratios over waveguide bandwidths, or with regard to a stripline construction, over multi-octave bandwidths.

With regard to the measurement of VSWR probably the most common aproach is to use a directional coupler. However, in order to provide an accurate measurement, in particular of low VSWR, there is the requirement of a precise mechanical construction of the directional coupler. Therefore, such devices have to be made within quite tight tolerances.

Accordingly, one object of the present invention is to provide a device that makes either complex reflection coefficient measurements or low VSWR measurements without the need of a coupler or the like that requires tight construction tolerances.

One of the oldest techniques for the measurement of complex reflection coefficients (both amplitude and phase) is the slotted line apparatus. In this apparatus, the measurement is accomplished by means of a mechanical procedure which is quite time consuming and not at all suitable for computerization of the measured data.

Accordingly, another object of the present invention is to provide a device which will allow for the rapid computerized evaluation of data. In accordance with the invention this is accomplished by means of direct measurement of two power levels. These power levels are then operated upon in accordance with the theory of this invention to provide readings of complex reflection coefficient or VSWR.

In another technique, the reflection coefficient is obtainable from the power measured at three fixed probes spaced one-eight wavelength apart along a slotted line. See, for example, the article by W. J. Duffin, "Three Probe Methods of Impedance Measurement", Wireless Engineer, Vol. 29, pp. 317-320 (Dec. 1952). However, with this technique, the refection coefficient is obtained with a high degree of accuracy only over a narrow frequency range for which the one-eighth wavelength condition is substantially satisfied.

Accordingly, a further object of this invention is to provide a device for measuring the complex reflection coefficient accurately by the sample measurement of power levels over a full waveguide bandwidth, or in the case of stripline or coax over a multi-octave bandwidth.

One prior art article by Henry J. Riblet "A Swept-Frequency 3-Centimeter Impedance Indicator", Procedings of the I.R.E., Vol. 36, pp. 1493-1499, Dec. 1948 describes a device for determining the complex reflection coefficient in waveguide from the powers coupled to two detectors. However, with this technique, the measurement accuracy is very sensitive to the actual phase of the reflected signal.

Thus, another object of the present invention is to provide a device for the measurement of reflection coefficients wherein the measurement accuracy is essentially independent of both amplitude and phase provided that the VSWR is less than 2/1.

An article by Henry L. Bachman, "A Waveguide Impedance Meter for the Automatic Display of Complex Reflection Coefficients", IEEE Trans. on MTT, Vol. 3, pp. 27-30, Jan. 1955 describes a waveguide impedance meter for the automatic display of complex reflection coefficients. However, the circuit configuration requires many waveguide components. Furthermore, it assumes for its operation a frequency independent 90°phase shifter for which no practical realization exists. Also, the actual bandwidth is limited to 10%. In another article by Glenn F. Engen, "An Improved Circuit for Implementing the Six-Port Technique of Microwave Measurements", IEEE Trans. on MTT, Vol. MTT-25, pp. 1080-1083, Dec. 1977 there is described a number of circuits for the accurate determination of the reflection coefficient over wide bandwidths from measurements of power levels at four detectors. Again, however, these circuits require many components and an elaborate calibration procedure must be performed before measurements can be taken.

Accordingly, another object of the present invention is to provide a device for the measurement of a reflection coefficient wherein only a simple calibration procedure is necessary and wherein the calculation of the coefficient can be accomplished by relatively simple formulas.

BRIEF DESCRIPTION OF THE DRAWINGS

Numerous other objects, features and advantages of the invention should now become apparent upon a reading of the following description of this invention taken in conjunction with the accompanying drawings in which:

FIGS. 12 and 13 show still further embodiments of the invention in the form of an optical apparatus for measuring reflection coefficient.

FIGS. 14–17 collectively illustrate a further embodiment of the invention in coax form.

EXPOSITION

Figure 1:
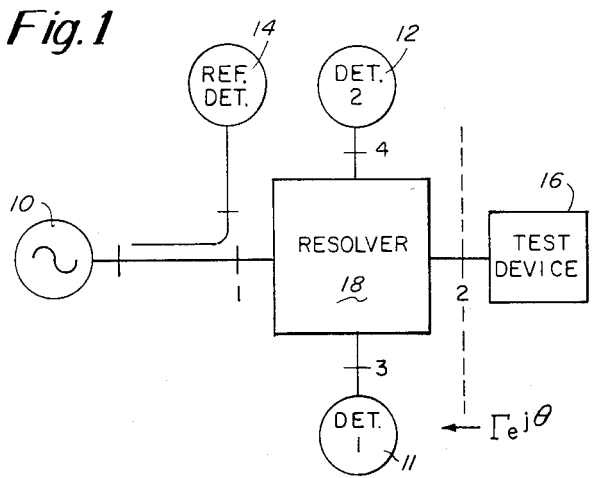
FIG. 1 schematically depicts the apparatus of the present invention for measuring reflection coefficient.

FIG. 1 schematically depicts the basic circuit configuration in accordance with the present invention including a signal source 10, detectors 11 and 12, reference detector 14, and the test device 16. All of these components are associated with the basic device of this invention disclosed in box 18 and shown in more detail hereinafter in different embodiments including a waveguide version and a stripline version of the invention. For the waveguide version the reference detector 14 is preferably used with a directional coupler to monitor the incident power to device 18. The reference detector 14 may be of conventional design as may be the detectors 11 and 12. As is apparent from FIG. 1 the device 18 is basically a four-port device with the ports numbered 1, 2, 3 and 4 as shown in FIG. 1.

It is a purpose of the invention to determine the parameters of the device enabling power to be coupled to detectors 11 and 12 in a way that the reflection coefficient $\Gamma$ is unambiguously determined from the powers measured at the detectors at ports 3 and 4. In accordance with the invention the accuracy of measurement is insensitive to the actual amplitude and phase of the reflection coefficient provided that the VSWR is less than 2/1. The VSWR of most components being tested satisfy this condition.

Figure 2A:
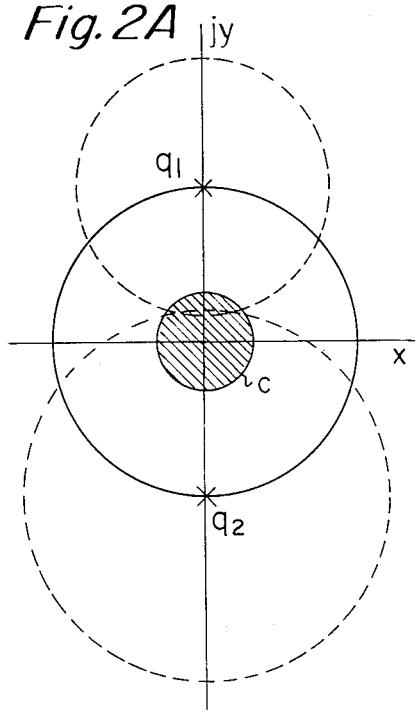
FIG. 2A shows the gamma plane diagram associated with a prior technique.
Figure 2:
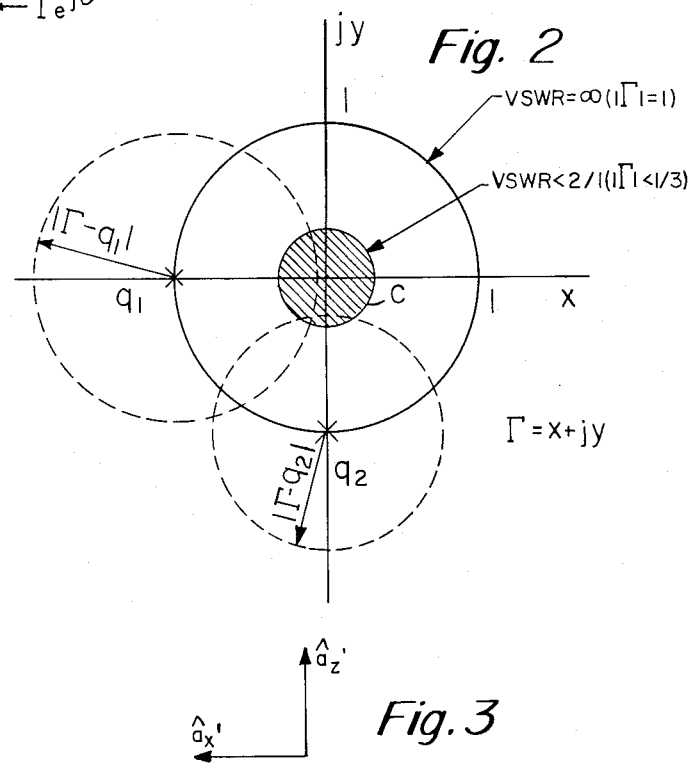
FIG. 2 shows a diagram in the complex gamma plane useful in determining the reflection coefficient.

An article by Glenn F. Engen, "The Six-Port Reflectometer: An Alternate Network Analyser", IEEE Trans. on MTT, Vol. MTT-25, pp. 1075–1080, Dec. 1977 discloses a diagram in the complex $\Gamma$ plane. FIG. 2 herein shows a complex $\Gamma$ plane diagram. At a particular frequency detectors 11 and 12 (see FIG. 1) are represented by points $q_1$ and $q_2$ in the complex plane. The measured power ratios $\bar{P}_1 = P_1/P_R$ and $\bar{P}_2 = P_2/P_R$, corresponding respectively to detectors 11 and 12, determine circles of known radius about points $q_1$ and $q_2$. It is the intersection between these circles that determines the complex reflection coefficient $\Gamma$. In FIG. 2 the point $q_1$ is located at the coordinate $-1$ on the x axis while the point $q_2$ is located at the coordinate $-j$ on the jy axis. A reflection coefficient cooresponding to VSWR less than 2/1 falls within the shaded circle C shown in FIG. 2. From FIG. 2 it can be seen that for such a reflection coefficient the circles about points $q_1$ and $q_2$ intersect nearly at right angles and thus the determination of $\Gamma$ is unambiguous and the measurement accuracy is substantially insensitive to the phase of the incident signal.

In the previous Riblet article, supra, the theory of operation developed differently from the theory described herein. In this connection reference is now made to FIG. 2A which shows the points $q_1$ and $q_2$ both on the jy axis at $+jy$ and $-jy$. The equations used in connection with the diagram of FIG. 2A do not permit the determination of both $\Gamma$ and $\theta$ unambiguously and accurately. In this regard there had been an assumption in the equations wherein the second equation such as our equation (5) used a $-\cos\theta$ term instead of our $+\sin\theta$ term. From FIG. 2A it is noted that there are two points of intersection within the unit circle C which points are symetrical about the jy axis. With this criteria of FIG. 2A any changes in the radius of the circles shown in dotted lines represent a substantial change in the magnitude of $\Gamma$. With reference to FIG. 2A it is noted that there are two intersections between the circles. This means that there are essentially two different phase values thus making the determination ambiguous. Thus, the arrangement in the previous Riblet article was sensitive to the phase of the incident signal.

In connection with the present invention and the diagram of FIG. 2, along with the schematic diagram of FIG. 1, if the amplitude of the incident signal from source 10 is represented by the parameter $|A|$, then:

$$P_{REF} = |C_{REF}|^2 |A|^2 \qquad (1)$$

$$P_1 = |C_1|^2 |A|^2 |\Gamma - q_1|^2 \qquad (2)$$

$$P_2 = |C_2|^2 |A| |\Gamma - q_2|^2 \qquad (3)$$

where $P_{REF}$, $P_1$ and $P_2$ are the powers measured at the reference detector 14, detector 11, and detector 12, respectively, while $|C_{REF}|^2$, $|C_1|^2$ and $|C_2|^2$ are coupling factors. The coupling factors $|C_{REF}|^2$, $|C_1|^2$ and $|C_2|^2$ may be equated because any difference in these factors can be referenced out in a computer or microprocessor based measurement system by taking a reference reading with a load on the output. Nevertheless, it is desirable in practice to have these coupling factors approximately equal. Under this restriction and by employing known mathematical formulas the following equations can be derived from equations (1), (2) and (3).

$$\bar{P}_1 = P_1/P_{REF} = |\Gamma + 1|^2 = 1 + |\Gamma|^2 + 2|\Gamma|\cos\theta \qquad (4)$$

$$\bar{P}_2 = P_2/P_{REF} = |\Gamma + j|^2 = 1 + |\Gamma|^2 + 2|\Gamma|\sin\theta \qquad (5)$$

Equations (4) and (5) are derived by assuming that the points in FIG. 2 are $q_1 = -1$ and $q_2 = -j$ as before. Equations (4) and (5) are in a sense the basic equations for determining $|\Gamma|$ and $\theta$ in terms of measured power ratios $P_1/P_{REF}$, $P_2/P_{REF}$. These power ratios may be normalized to normalized powers $\bar{P}_1$ and $\bar{P}_2$. Thus, the magnitude of $\Gamma$ is given by the expression:

$$|\Gamma|^2 = \frac{\bar{P}_1 + \bar{P}_2}{2} - \sqrt{\left(\frac{\bar{P}_1 + \bar{P}_2}{2}\right)^2 - \left(\frac{\bar{P}_1 - 1}{2}\right)^2 - \left(\frac{\bar{P}_2 - 1}{2}\right)^2} \qquad (6)$$

Equations (4) and (5) have been derived by assuming the values of $q_1$ and $q_2$ defined above. This allows for the unambiguous determination of $\Gamma$ for the case of small VSWR which is of most practical interest. Now, with this initial determination a circuit is now constructed to yield these parameters. In order to accomplish this it is best to express the powers $P_1$ and $P_2$ in terms of the S matrix elements of the network shown in FIG. 1. The following S matrix relationships apply:

$$\bar{P}_1 = \{S_{13} + S_{23}S_{12}\Gamma\}\{S_{13}^* + S_{23}^*S_{12}^*\Gamma^*\}$$

$$\bar{P}_2 = \{S_{14} + S_{24}S_{12}\Gamma\}\{S_{14}^* + S_{24}^*S_{12}^*\Gamma^*\}.$$

Therefore $$\bar{P}_1 = |S_{13}|^2 + |S_{23}|^2 |S_{12}\Gamma|^2 + (S_{13}S_{23}^*S_{12}^*\Gamma^* + S_{13}^*S_{23}S_{12}\Gamma)$$

$$\bar{P}_2 + |S_{14}|^2 + |S_{24}|^2 |S_{12}\Gamma|^2 + (S_{14}S_{24}^*S_{12}^*\Gamma^* + S_{14}^*S_{24}S_{12}\Gamma)$$

With the above S matrix relationships the subscripts for the S matrix elements correspond to the numbered ports shown in FIG. 1. Thus, for example, the term $S_{13}$ refers to coupling between the input port and detector 11. If the relationships of equations (1)–(5) are applied to the above S matrix relationships then;

$$S_{13} = S_{23} \tag{7}$$

$$S_{14} = e^{j\pi/2} S_{24} \tag{8}$$

$$S_{12} = 1 \tag{9}$$

A further condition which in practice need not hold exactly is $|S_{13}| = |S_{14}|$. From the reciprocity principle equation (7) denotes that the signal divides equally out of ports 1 and 2 when feeding port 3, and further equation (8) denotes that signals from ports 1 and 2 should differ only in a phase difference of 90° when feeding port 4.

The condition represented in equation (9) is impossible to satisfy exactly. However, an approximate condition can be derived by making the coupling to detectors 11 and 12 weak (30 dB or so). Under that condition the equations (4) and (5) are satisfied to a high degree of accuracy if one remembers that $\theta$ also includes the phase shift due to $S_{12}$. This phase term may be removed by an appropriate shift of the reference plane. The weak coupling condition which can be stated as $$|S_{12}| \lesssim 1 \tag{10}$$

has some practical advantages. For a typical input power of +10 dBm and 30 dB coupling, the power to the detectors will be −20 dBm. This is large enough so that the signal won't be noisy but not so large as to be in the highly non-linear region of the detectors. Furthermore, because of the weak coupling, the errors introduced by detector mismatches and imperfect components are minimized.

Waveguide Embodiment

Figure 3:
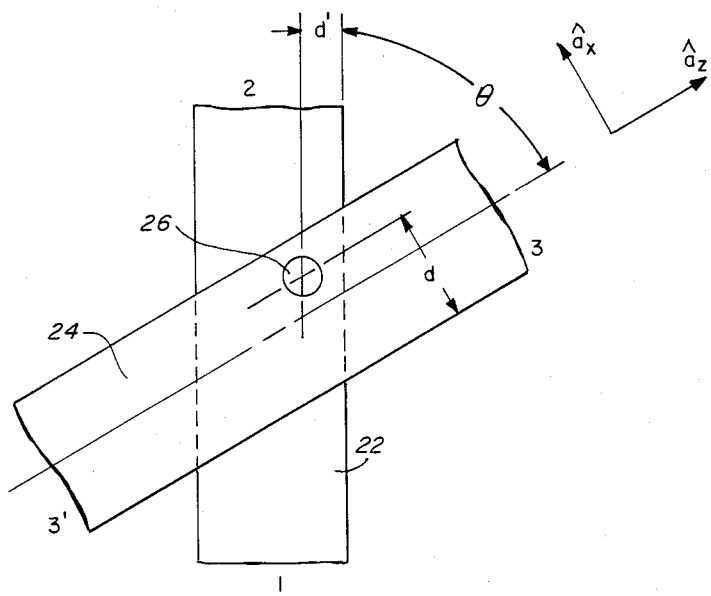
FIG. 3 schematically depicts a coupling structure in accordance with the present invention including a main arm and one secondary arm.

FIG. 3 schematically depicts a representation of the device 18 of FIG. 1 showing the main ports 1 and 2 as identified in FIG. 1 and also showing ports 3 and 3' which may, for example, be associated with port 3 coupled to detector 11 in FIG. 1. This schematic diagram of FIG. 3 may be considered as including waveguide sections 22 and 24. Equations (7) and (8) can be relatively simply satisfied with this representative structure by coupling the main arm 22 to the secondary arm 24 through an appropriately positioned hole 26 schematically represented in FIG. 3. The desired 30 dB coupling is readily obtainable with such a single hole. In the specific version discussed hereinafter in FIGS. 4–7 the secondary arm for detector 11 is located on the top wall of main arm 22. In this case there are provided a pair of coupling holes, one for each detector. As described hereinafter, the unused secondary arm ports are terminated in loads.

A condition of equations (7) and (8) is that the power divides equally out of the main arm ports 1 and 2 when feeding either detector port. By applying the Bethe small hole coupling theory, it can be determined under what circumstances this condition is satisfied preferably independent of frequency. In fact, there are two situations which lead to equal power division independent of frequency:

Case I: $\theta = 90°$ ($\cos\theta = 0$); d or d' = a/2 (refer to FIG. 3) i.e. the waveguides are at right angles and the hole is centered in one of the waveguides.

Case II: $\theta \neq 90°$; d=0, d'=a/2 or d=a/2, d'=0 i.e. the waveguides are not at right angles but the hole is centered in one waveguide and against the wall of the other.

Figure 8:
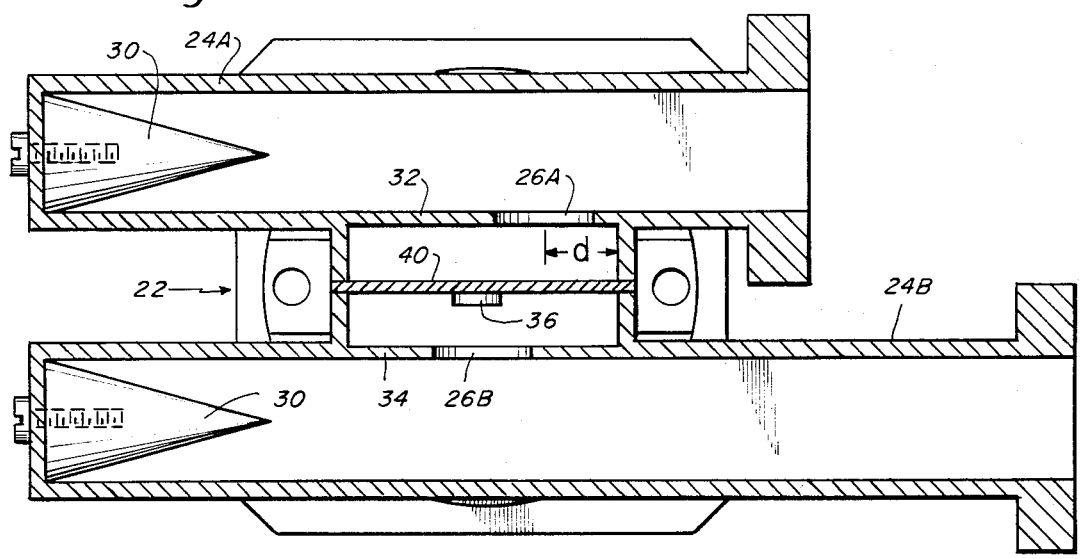
FIGS. 8 and 9 are cross-sectional views showing an alternate waveguide version in accordance with the invention.
Figure 9:
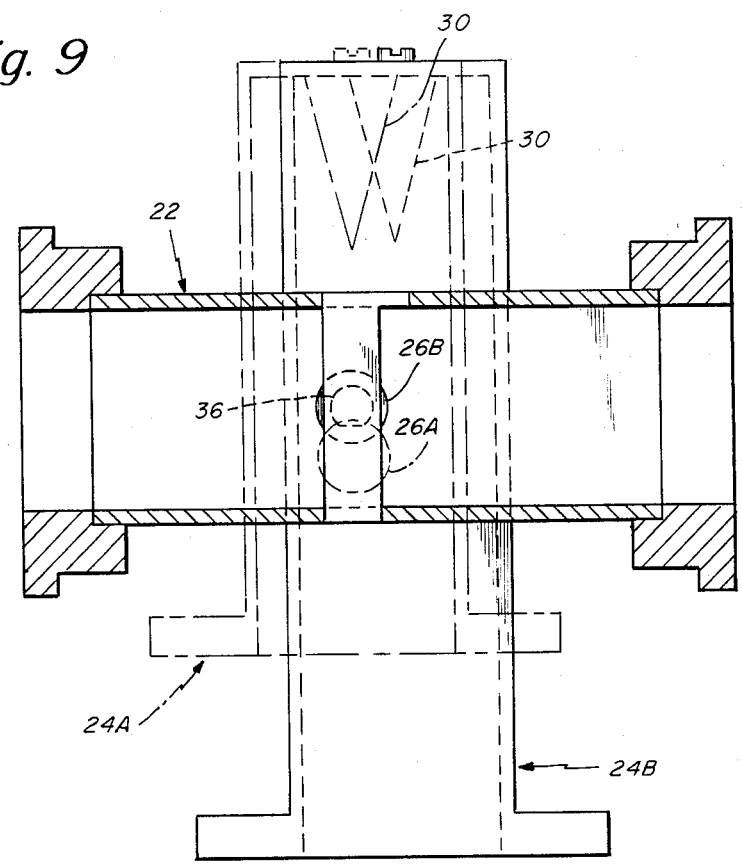

The condition represented by equation (8) cannot be satisfied with Case II and thus this case is considered to not be useful. The condition of equation (7) is possible to satisfy with Case I. This is accomplished by centering the hole in one of the secondary arms with this hole also being off-center in the main arm. For example, in FIGS. 8 and 9, reference is made to hole 26A which is centered in the secondary arm 24A but off-center in the main arm 22 as denoted in FIG. 9. From symmetry and reciprocity it is known that $S_{13} = S_{31} = S_{32} = S_{23}$. Under Case I equation (8) is somewhat more difficult to satisfy. The other hole, such as the hole 26B shown in FIGS. 8 and 9 is off-center in the secondary arm, such as arm 24B, and is centered in the main arm. Within a common proportionality factor the S matrix elements $S_{14}$, $S_{24}$ are given by the Bether theory as:

$$S_{14} = -\alpha_e \frac{\lambda^2_g}{\lambda^2} \sin\frac{\pi d}{a} + j\frac{\lambda_g}{a} \alpha_m(1) \cos\frac{\pi d}{a} \tag{11}$$

$$S_{24} = -\alpha_e \frac{\lambda^2_g}{\lambda^2} \sin\frac{\pi d}{a} - j\frac{\lambda_g}{a} \alpha_m(1) \cos\frac{\pi d}{a} \tag{12}$$

where $\lambda_g$ is the guide wavelength, $\lambda$ is the wavelength, a is the waveguide width, d is the distance of the center of the hole from the waveguide wall in the secondary arm, $\alpha_e$ and $\alpha_m$ (1) are electric and magnetic polarizeabilities of the hole.

It is apparent from equations (11) and (12) that the phase $\theta$ of $S_{24}$ with respect to $S_{14}$ may be varied by varying the distance d of the hole from the wall of the secondary arm. The phase difference is given by $$\theta = 2\,\text{Tan}^{-1} \frac{\lambda^2}{a\lambda_g} \frac{\alpha_m(1)}{\alpha_e} \cot\frac{\pi d}{a} \tag{13}$$

$$= 2\,\text{Tan}^{-1} \sqrt{\lambda^2 - \lambda^4/\lambda_c^2}\, \frac{\alpha_m(1)}{a\,\alpha_e} \cot\frac{\pi d}{a}$$

where $\lambda_c$ is the cut-off wavelength of the waveguide. In the following it is assumed that circular holes are used in which case $\alpha_m(1) = \alpha_e$. These holes give the largest coupling for a given value of $\theta$. If $\theta = 90°$ then $$d = \frac{a}{\pi} \text{Tan}^{-1} \frac{\lambda^2}{a\lambda_g} \tag{14}$$

This formula determines the required hole location in terms of a and $\lambda$. For a WR-90 waveguide at a center frequency of 9.375 GHz, the dimension d=0.225″. Ideally, the phase difference $\theta$ should be 90° and independent of frequency (wavelength). From equation (13) this will not be the case in practice, however, it will track 90° fairly closely over a waveguide band. It can readily be shown that $$\frac{d\theta}{d\lambda} = 0$$

for some frequency within the waveguide band. It follows from equation (13) that $$\frac{d\theta}{d\lambda} = o \text{ if } \frac{d(\lambda^2 - \lambda^4/\lambda_c^2)}{d\lambda} = o.$$

Thus, $$\frac{d(\lambda^2 - \lambda^4/\lambda_c^2)}{d\lambda} = 2\lambda - 4\lambda^3/\lambda_c^2 = o => \lambda = \lambda_c/\sqrt{2}.$$

For a WR90 waveguide this will occur at 9.273 GHz. The variation in $\theta$ is expected to be small over the waveguide band of 8.2 to 12.4 GHz.

Figure 4:
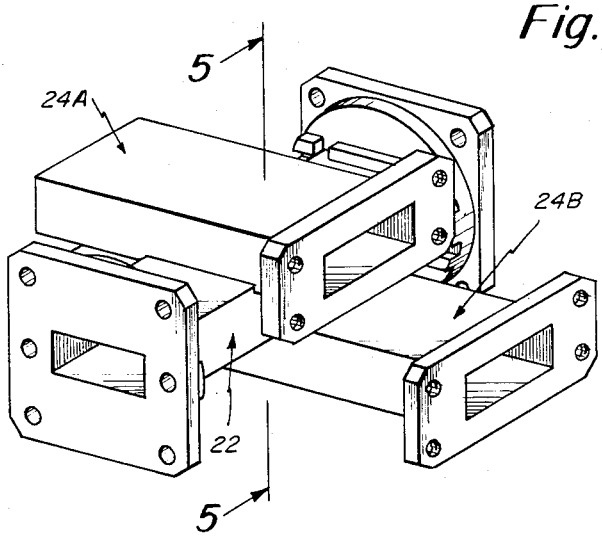
FIG. 4 is a perspective view of an apparatus of the present invention constructed in waveguide.

FIG. 4 is a perspective view showing the basic outer construction of the device of this invention including the main arm 22 and a pair of secondary arms 24A and 24B which are both disposed at a 90° angle to the main arm 22. All of these arms may include conventional flanges so that the device can be connected to other means such as the test device, the detectors and the input signal source. For the sake of simplicity these components are not shown in detail but are referred to in the schematic diagram of FIG. 1. The main guide arm 22 has flanges at both ends while each of the secondary arms has a flange only at one end. The closed ends of the secondary arms are terminated by means of a load 30 depicted in the drawings.

The embodiment just previously discussed is the one shown in FIGS. 8 and 9 wherein the coupling hole is centered in one secondary arm and off-center in the main arm and is off-center in the other secondary arm and centered in the main arm. In FIGS. 8 and 9 the holes 26A and 26B are shown in their respective walls 32 and 34. As previously indicated this embodiment may be constructed in WR-90 waveguide or could be constructed in other waveguide bands. The holes 26A and 26B may have a diameter of 0.312" with a wall thickness (walls 32, 34) of 0.030" providing a coupling of 30 dB±1 dB for the band of 8.2–12.4 GHz. In order to achieve nearly the same coupling to both detectors the same hole size was used in both secondary arms but the hole was symmetrically located in the secondary arm with regard to the top hole and symmetrically located in the main arm with regard to the bottom hole 26B. Generally, the Bethe theory applies only in the limit of very small holes. Even at a coupling level of 30 dB significant deviations from the Bethe theory have been found experimentally. In order to re-establish the equal power division requirement for the non-symmetrical arm and to improve the input match, it was found to be useful to put a capacitive button 36 on a septum 40 facing the bottom hole 26B as indicated in FIG. 8. With the use of this matching structure the input VSWR was less than 1.07 and the coupling unbalance less than 0.2 dB for the range of 8.2–12.4 GHz.

In the complex $\Gamma$ plane of FIG. 2, the centers for the concentric circles shown as dotted lines have been at points $q_1 = -1$ and $q_2 = -j$. These points may actually be chosen at any location along the unit circle shown in solid in FIG. 2 provided that the points are separated by 90°. Because of this generalization equations (7) and (9) may thus be written in a more general sense as:

$$S_{13} = e^{j\beta} S_{23} \quad (15)$$

$$S_{14} = e^{j(\pi/2+\beta)} S_{24} \quad (16)$$

where $\beta$ is a reference phase angle. The conditions set forth in equations (15) and (16) lead to relatively minor modifications of the basic equations (4) and (5). Thus, in another example in accordance with the invention the points on the diagram of FIG. 2 may be selected so that $$q_1 = \frac{-1+j}{\sqrt{2}} \text{ and } q_2 = \frac{-1-j}{\sqrt{2}}.$$

Figure 5:
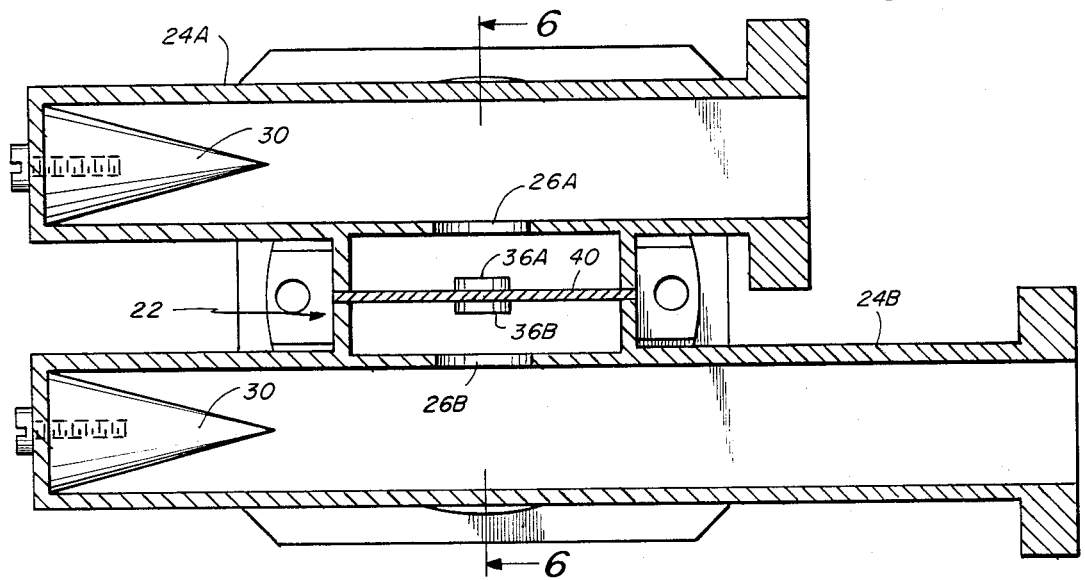
FIGS. 5-7 show one specific waveguide version of the present invention.
Figure 6:
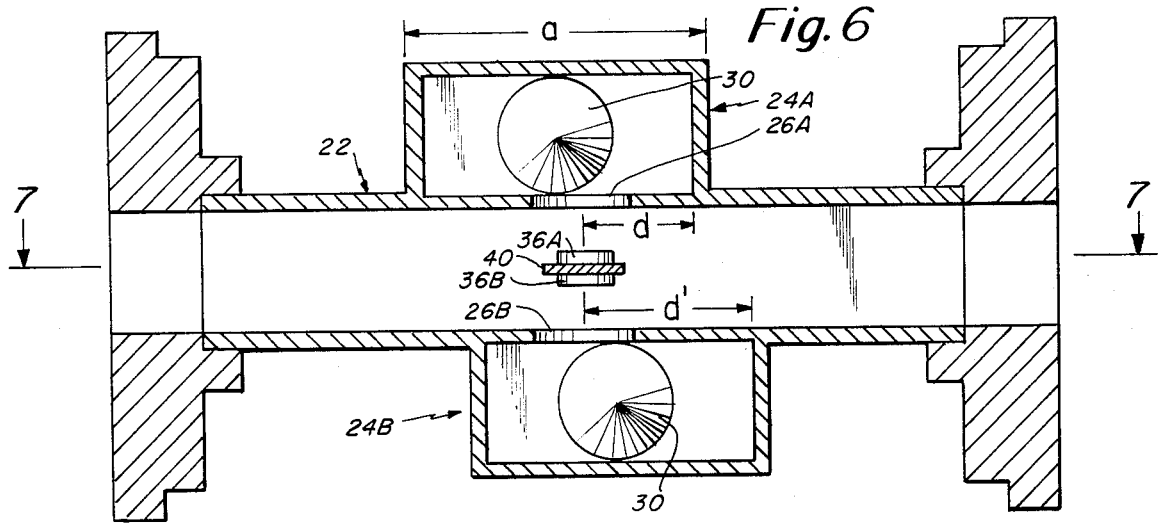
Figure 7:
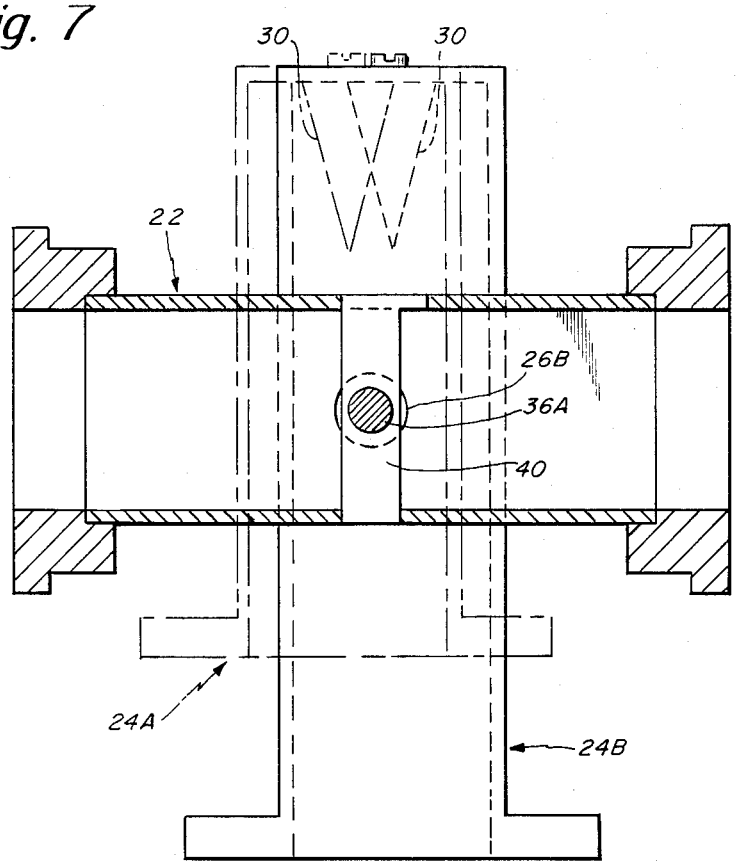

For this condition reference is now made to the embodiment shown in FIGS. 5–7 wherein both of the holes 26A and 26B are centered in the main waveguide arm 22 but are off-centered in the secondary waveguide arms 24A and 24B so that the phase relationship of equations (15) and (16) apply. In the embodiment of FIGS. 5–7 the hole diameter and wall thickness may be the same as previously discussed with regard to FIGS. 8 and 9. The hole may have a diameter of 0.312" while the wall thickness may be 0.030". The distance d and d' depicted in FIG. 6 can be found approximately by solving equation (13) with $\theta = 45°$ and $-45°$ for a WR90 waveguide at a center frequency of 9.375 GHz. The dimensions d and d' are d=0.337" and d'=0.563". For the embodiment of FIGS. 5–7 it is noted that the device has four-fold symmetry. With this embodiment there may also be provided a pair of matching buttons 36A, 36B on a septum 40 as depicted, for example in FIG. 6. In the two embodiments described in FIGS. 5–9 circular holes have been shown. However, elliptical shaped coupling holes could also be provided although there is little to be gained by using the elliptical hole in place of the circular hole.

Stripline Embodiment

Figure 10:
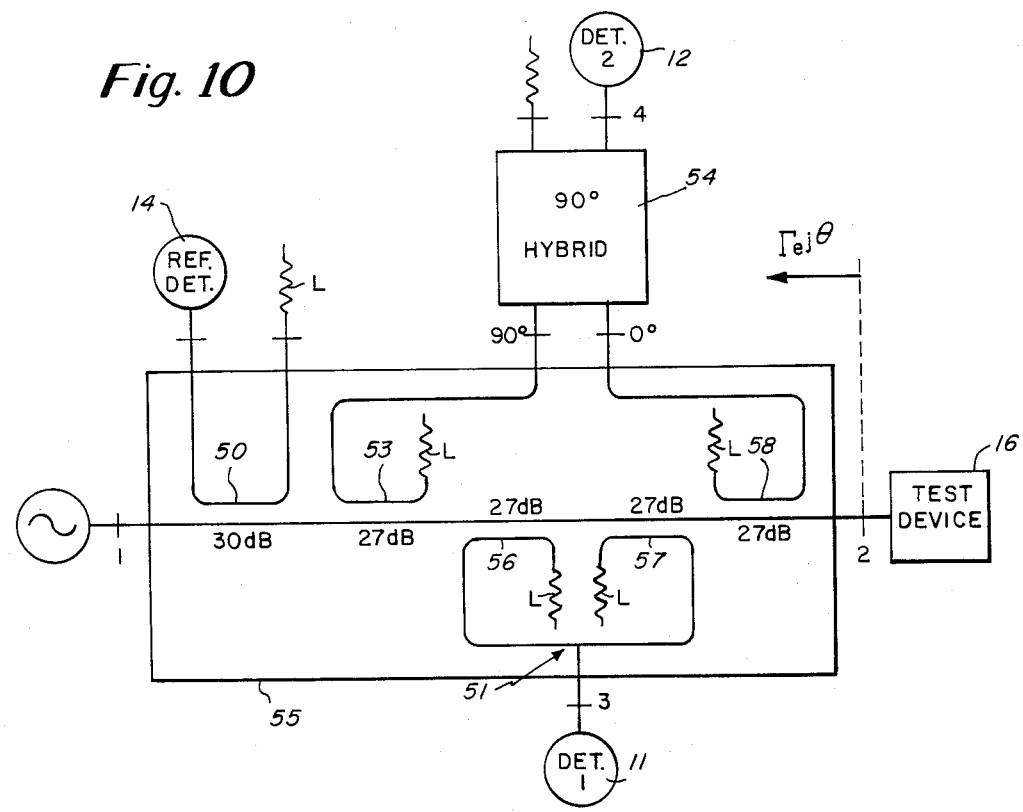
FIG. 10 schematically depicts a stripline version of the present invention showing the connections to the two detectors, the device being tested and the signal source.
Figure 11A:
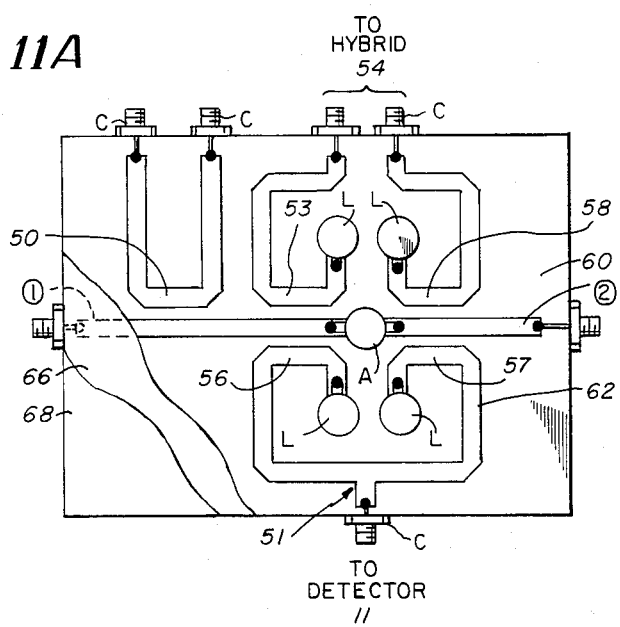
FIG. 11A is a plan view of a stripline version of the present invention showing the circuit etching.
Figure 11B:
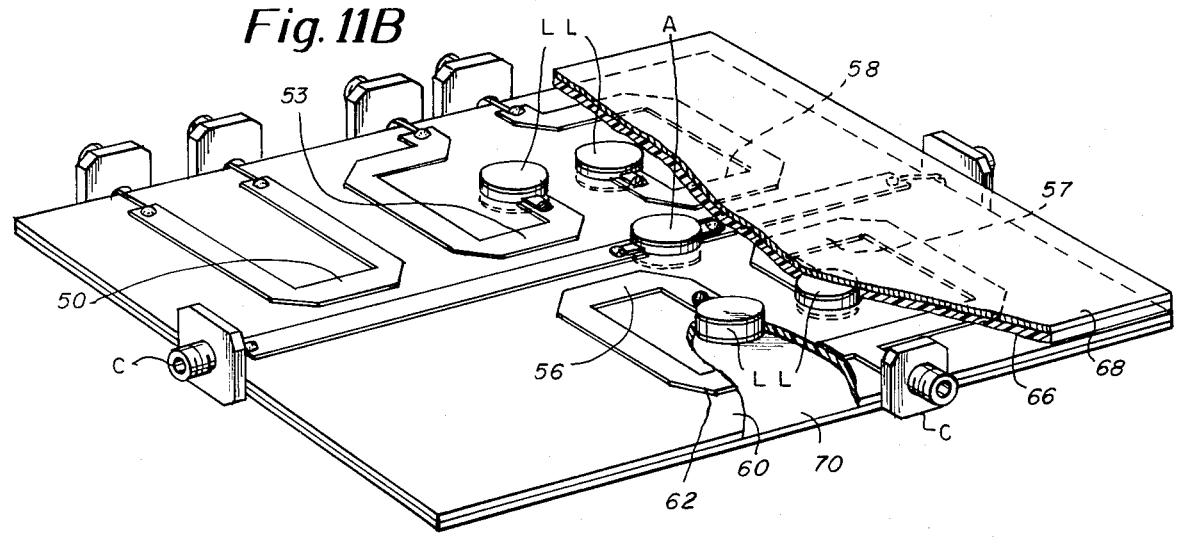
FIG. 11B is a perspective view that is partially cut away showing the device constructed in stripline including all connectors.

With regard to the construction of a compact broadband stripline network, FIG. 10 is a schematic diagram showing a stripline circuit. FIGS. 11A and 11B depict an actual device constructed in stripline and embodying the principles of this invention. In the interpretation of equations (7) and (8) the reciprocity principle may be applied so that $S_{31} = S_{13}$, $S_{32} = S_{23}$, $S_{41} = S_{14}$ and $S_{42} = S_{24}$. By application of this reciprocity principle to equations (7) and (8) and with reference to FIG. 10 and the port numbering denoted therein power at port 3 divides equally with identical phase out of ports 1 and 2. This suggests the use of a broadband power divider 51 at port 3. Also, power at port 4 divides equally between ports 1 and 2 with a 90° phase difference between the signals out of ports 1 and 2. This suggests the use of a broadband 90° hybrid 54 at port 4. Furthermore, means must be provided to couple weakly to the main line extending between ports 1 and 2 so that the weak coupling condition of equation (10) is satisfied. This may be accomplished using a broadband coupled line couplers 50, 53, 56, 57 and 58 as noted in FIG. 10. The first coupler 50 has 30 dB coupling and is used in association with the reference detector 14. Of course, each of the coupling lines is also terminated by means of a load L as also shown in FIG. 10. The first power level detector 11 couples by way of the power divider 51 to couplers 56 and 57. As denoted these couplers couple to the main line with 27 dB coupling. In fact, the coupling to the line 1-2, is by this loose coupling other than at the coupler 50. Thus, the second detector 12 copules to the main coupling 1-2 by means of the hybrid 54. The couplers 53 and 58 couple the signals from the main line to the hybrid 54. Multi-octave couplers with this type of coupling level are readily constructed. A diagram of a planar stripline device, as far as the etched circuit is concerned, is shown in FIG. 11. This device covers the 2–8 GHz band. If single step coupled line couplers are used, then in theory a copuling of 27 dB±3 dB and 30 dB±dB can be achieved over this frequency range.

It may be desirable to have the hybrid 54 shown in FIG. 10 external to the basic coupling structure as indicated by the solid line 55. This permits flexibility of choosing a high quality hybrid appropriate to a narrower frequency range than the operating range of, for example, 2–8 GHz. The quality of the hybrid 54 largely determines how well the equations (4) and (5) are approximated. The two pairs of 27 dB couplers on each side of the main line 1–2 may be arranged to face each other rather than in the staggered manner shown in FIG. 10.

In the waveguide embodiment discussed previously and with reference to FIG. 2 the reference points $q_1$ and $q_2$ may be arranged at different locations on the unit circle but always separated by 90°. However, if $|S_{12}| < 1$, then equation (10) no longer holds and the points $q_1$ and $q_2$ may lie outside of the unit circle. This can be useful under some circumstances. For example, if the directional couplers as shown in FIG. 10 have relatively tight coupling such as 6 dB coupling then $q_1 = -2$ and $q_2 = -2j$. This means that the line between points $q_1$ and $q_2$ will not intersect the unit circle. Thus, there is no ambiguity in the determination of reflection coefficients for which $|\Gamma| <$ or $= 1$, which is the case for passive devices. A similar effect can be achieved by inserting a 6 dB attenuator pad in the main line 1–2 at the symmetry axis connecting ports 3 and 4 (the coupling values noted in FIG. 10 remain the same). With this arrangement the only additional requirement is that an additional reference measurement of the transmitted power has to be made before measurements can be made.

FIGS. 11A and 11B show a device constructed in accordance with the schematic diagram of FIG. 10. This device includes a printed circuit board 60 having the coupler circuits, the main coupling line and the divider etched thereon preferably in copper. The drawing shows the various conductors 62 that form the stripline circuit. In FIGS. 11A and 11B like reference characters are used as previously identified in FIG. 10 to identify the different circuits disclosed. In addition to the printed circuit board 60 there is also provided a plane dielectric board 66 with both boards being sandwiched between ground planes 68 and 70. FIG. 11B also shows connectors C associated with the circuit such as at both ports 1 and 2 of the main coupling line. These connectors enable connection to the detectors, the input signal source and the device under test.

Conducting walls (not shown) may be placed between the circuit elements shown in FIG. 11B. These conducting walls are used for preventing the propagation of higher modes in the apparatus. For example, a conducting wall may extend perpendicular to the main line between couplers such as couplers 50 and 53 shown in FIG. 11B. Also, walls may extend between couplers 53 and 58 and 56 and 57. Furthermore, there may be a conductor wall within, for example, coupler 50 again extending in a direction perpendicular to the main line.

In an alternate embodiment of the present invention the apparatus may be constructed in coax including a solid mass that may be machined to receive a center conductor. The conducting strips shown in FIG. 11B would become solid center conductors suspended in troughs or grooves machined in a solid piece of metal. With such a coax construction there is inherently no or very little problem of high mode propagation.

The use of an attenuator has previously been discussed. FIG. 11B shows the attenuator A in the main coupling line. This attenuator may be of conventional design having leads coupling to the main line 1–2 and including upper and lower conductors for conductively contacting the respective ground planes. Similarly, the boards 60 and 67 may be drilled to receive the loads L, four of which are used in this embodiment. The load L also has a single lead connecting to the copper conductor or etching 62.

Optical Embodiment

FIGS. 12 and 13 show an optical device in accordance with the present invention in two different embodiments. At frequencies above the microwave range it is common to use quasi-optical techniques. At sufficiently high frequencies directional couplers may be constructed using partially reflecting mirrors, thin dielectric sheets, or closely spaced prisms. The coupled line couplers of FIG. 10 may be replaced by optical couplers as depicted in FIGS. 12 and 13. FIG. 12 shows a diagram of an optical network which uses partially reflecting mirrors as couplers. In the embodiment of FIG. 12 in comparison to the one of FIG. 10, the power divider 51 at port 3 is replaced with a beam splitter 66 along with $\lambda/4$ path difference to the two outer mirrors, while the hybrid 54 at port 4 is replaced with a second beam splitter 64. As a result, the ideal equations only apply at that frequency for which the path difference is in face $\lambda/4$. However, these equations can be modified to give accurate results over a bandwidth of at least an octave provided that the actual frequency is known. If the reflected amplitude and phase varies over the width of the beam, then this variation could be recorded by replacing the photo detectors 70 and 72 with photographic film. In effect the reflected amplitude and phase over a two dimensional field of view will be mapped uniquely onto 2 two-dimensional intensity fields in such a way that one can be constructed from the other using simple mathematical formulii. When one speaks of light waves, one must be concerned about polarization. To completely characterize the reflected signal, one must know the reflected amplitude and phase for two independent polarizations (a total of four quantities). This additional information may be obtained with a simple modification of FIG. 12 as provided in FIG. 13. In FIG. 13 additional photodetectors 74 and 76 have been added opposite photodetectors 70 and 72, respectively, giving a symmetrical arrangement. One sort of polarizer is located in front of detectors 70 and 72 and the other sort in front of detectors 74 and 76. These polarizers are identified as polarizers 70', 72', 74' and 76', respectively. In this arrangement detector 70 and 72 determine $\Gamma$ for one kind of polarization and detectors 74 and 76 determine $\Gamma$ for the other opposite polarization.

Reference has been made previously to a further embodiment of the invention in coax including a solid mass that may be machined to receive a center conductor. To more completely illustrate the suggested embodiment, reference is now made to FIGS. 14–17 which show the coax version of the invention.

Figure 16:
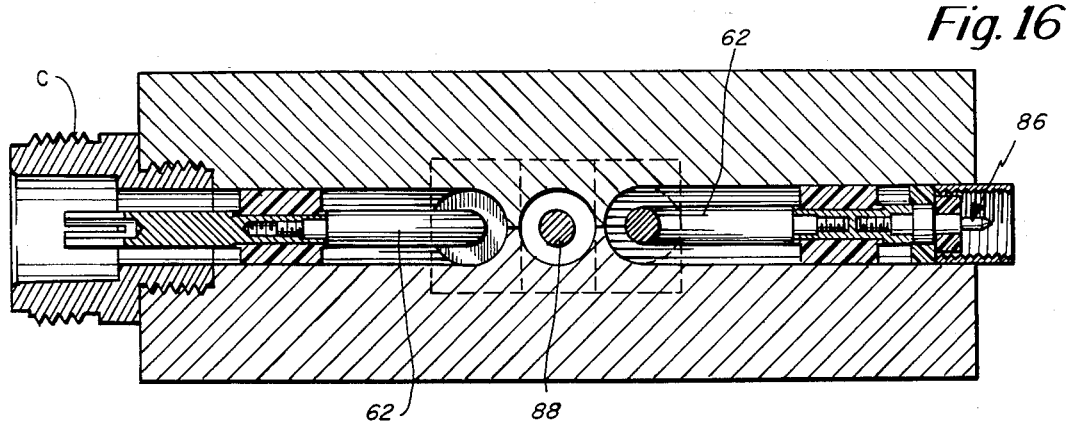
Figure 17:
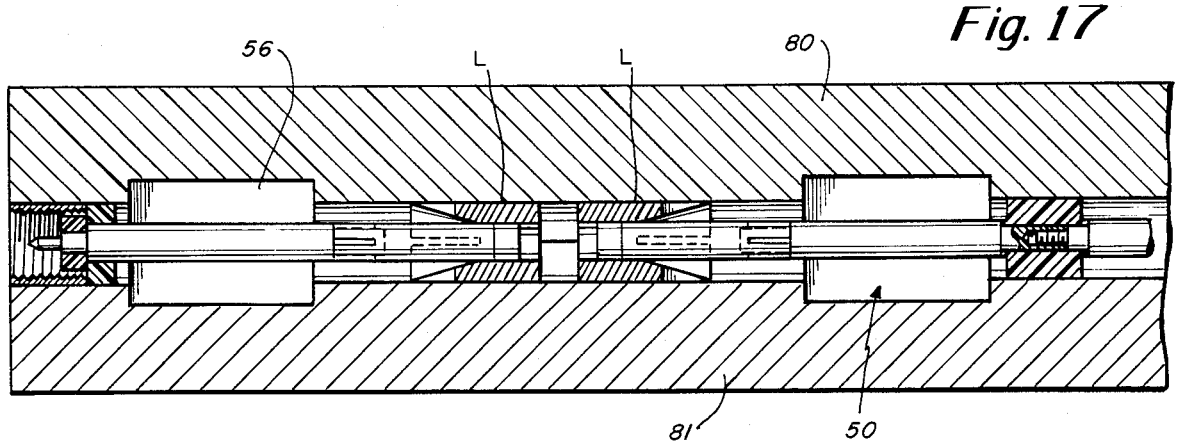

FIG. 14 illustrates in a plan view the general components that comprise the coax circuit. FIG. 15 is a side elevation view showing both body members that comprise the coax block. FIGS. 16 and 17 are respective cross-sectional views taken from FIG. 14.

Again, with regard to FIGS. 14–17, there is shown an actual device constructed in coax and embodying the principles of this invention. In explaining the coax version, reference should be also made to the stripline embodiment which is the embodiment that most closely relates to the coax embodiment at least as far as the structural details are concerned. Thus, in the coax embodiment like reference characters are employed to identify like components previously discussed with regard to FIGS. 10, 11A and 11B. Also, the previous analysis relating to the porting and coupling also applies to the coax embodiment now to be described.

Thus, there is provided a divider 51 at port 3. This divider may be of conventional type adapted to be inserted into the slots defined in the metallic body members 80 and 81. Incidentally, the body members are fastened together by means of a series of screws 82 and are held in alignment by means of aligning pins 83. These metallic blocks in essence form the outer conductor with the circuits described in, for example, FIG. 14 being inner conductors such as shown at 62. The coax embodiment also is adapted for connection to a hybrid 54. Thus there are provided a pair of coax connecters 85 and 86 which are adapted to couple to a coax hybrid. This is a broad band 90° hybrid. The weak coupling characteristics established previously and discussed in connection with the stripline embodiment, require the use of broad band coax line couplers 50, 53, 56, 57 and 58 as denoted in FIG. 14. The power divider 51 is adapted for external connection to a first detector. The signal path is by way of the divider to couplers 56 and 57. These couplers couple to the main line or center conductor 86 preferably with 27 dB coupling. The second detector not shown in FIG. 14 but in accordance with that shown in FIG. 10, couples to the main line 86 by means of the hybrid 54 and couplers 53 and 58. As with the stripline embodiment previously described, the coax version may also have a operating band of 2–8 GHz. Each of the couplers may be of convention design and the coupling that may be provided to the main line may be of the type described in connection with FIG. 10. It is noted that each of these couplers has associated therewith a load L. This is also analysis that the lows that are used in the stripline version of FIG. 10. One of the advantages to the coax version referred to previously is that no or very little high mode propagation occurs.

What is claimed is:

1. Apparatus for measuring the reflection coefficient of a device by detecting normalized power level, comprising;
   main coupling means having means for receiving a test signal and means for coupling to the device being measured,
   first and second secondary coupling means associated with the main coupling means,
   first and second detectors associated, respectively, with the first and second secondary coupling means,
   and means coupling each secondary coupling means to the main coupling means with the normalized power levels $\bar{P}_1$ and $\bar{P}_2$ respectively associated with the first and second detectors being provided in accordance with the following equations:

$$\bar{P}_1 = 1 + |\Gamma|^2 + 2|\Gamma| \cos \theta$$

$$\bar{P}_2 = 1 + |\Gamma^2 30\ 2|\Gamma| \text{ sine } \theta$$

where $|\Gamma|$ is the magnitude of the reflection coefficient and $\theta$ is its phase.

2. Apparatus as set forth in claim 1 wherein the magnitude of the complex reflection coefficient $\Gamma$ is given by:

$$|\Gamma|^2 = \frac{\bar{P}_1 + \bar{P}_2}{2} - \sqrt{\left(\frac{\bar{P}_1 + \bar{P}_2}{2}\right)^2 - \left(\frac{\bar{P}_1 - 1}{2}\right)^2 - \left(\frac{\bar{P}_2 - 1}{2}\right)^2}$$

where $\bar{P}_1$ and $\bar{P}_2$ are the normalized powers measured at the respective first and second detectors.

3. Apparatus as set forth in claim 1 wherein the main coupling means comprises the main waveguide arm and the secondary coupling means each comprise a secondary waveguide arm.

4. Apparatus as set forth in claim 3 wherein both secondary arms extend substantially transverse to the main arm and each have termination means at an end opposite to the detector ends of each secondary arm.

5. Apparatus as set forth in claim 3 wherein both secondary arms extend at an angle of substantially 90° to the main waveguide arm.

6. Apparatus as set forth in claim 3 wherein said means coupling each secondary coupling means to the main coupling means includes means defining a coupling hole, one coupling between the main arm and one of the secondary arms and another coupling between the main arm and the other of the secondary arms.

7. Apparatus as set forth in claim 6 wherein the one coupling hole is centered in the main arm and off-center in the one secondary arm and the other coupling hole is centered in the main arm and off-center in the other secondary arm.

8. Apparatus as set forth in claim 6 wherein the one coupling hole is centered in the one secondary arm and off-centered in the main arm and the other coupling hole is centered in the main arm and off-center in the other secondary arm.

9. Apparatus as set forth in claim 7 wherein the coupling holes are circular.

10. Apparatus as set forth in claim 8 wherein the coupling holes are circular.

11. Apparatus as set forth in claim 6 wherein the arms are all of rectangular waveguide with one of the secondary arms longer than the other.

12. Apparatus as set forth in claim 6 including a septum in the main arm having at least one capacitive button associated therewith, said button aligning with a coupling hole.

13. Apparatus as set forth in claim 6 including a rod extending across the main waveguide arm in the long dimension with a sleeve aligning with a coupling hole mounted thereon.

14. Apparatus as set forth in claim 1 wherein said first and second secondary coupling means comprise four directional couplers in series, a first pair of which are associated with the first secondary coupling means and a second pair of which are associated with the second secondary coupling means.

15. Apparatus as set forth in claim 14 wherein the first pair of couplers are spaced a greater distance along the main coupling line than the second pair.

16. Apparatus as set forth in claim 14 wherein the directional couplers are line couplers in stripline, microstrip or coax with two of the secondary lines being on one side of the main line and the other two on the other side of the main line.

17. Apparatus as set forth in claim 16 wherein the two pairs of secondary lines face one another.

18. Apparatus as set forth in claim 17 wherein the first two couplers are separated from the last two by an attenuator in the main line.

19. Apparatus as set forth in claim 14 wherein the directional couplers comprise one of partially reflecting mirrors, thin dielectric sheets, and closely spaced prisms.

20. Apparatus as set forth in claim 1 including a reference detector and means coupling the reference detector to the main coupling means.

21. Apparatus as set forth in claim 1 wherein said secondary means includes a pair of couplers having relatively loose coupling associated, along with a power divider, with one of the detectors and a second pair of couplers having relatively loose coupling associated, along with a 90° hybrid, with the other detector.

22. Apparatus as set forth in claim 1 wherein said means coupling each secondary means to the main coupling means includes partially reflecting means.

23. Apparatus as set forth in claim 1 wherein said apparatus is constructed in coax.

24. Apparatus as set forth in claim 23 including metal support means forming the outer conductor in the coax circuit.

25. A four port apparatus for measuring the reflection coefficient of a device by detecting power levels, comprising;
main coupling means having means defining a first port for receiving a test signal and means defining a second port for coupling to the device being measured,
first and second secondary coupling means having means defining third and fourth ports, respectively of the apparatus,
first and second detectors connected respectively at the third and fourth ports,
and means coupling each secondary coupling means to the main coupling means such that when feeding a signal into one secondary port the signals from the first and second ports are the same and when feeding the other secondary port the signals from the first and second ports differ only in a phase difference of 90°.

26. Apparatus as set forth in claim 7 wherein one coupling hole overlies the other coupling hole at substantially the same position along the main arm.

27. Apparatus as set forth in claim 8 wherein both coupling holes are centered along a line extending orthogonally of the direction of the main arm.

28. A four part apparatus as set forth in claim 25 wherein the power levels are normalized power levels $\bar{P}_1$ and $OVs/P/_2$, respectively associated with the first and second detectors, said normalized power levels being identified by the following equations:

$$\bar{P}_1 = 1 + |\Gamma|^2 + 2|\Gamma| \cos \theta$$

$$\bar{P}_2 = {}^{\prime} + |\Gamma|^2 + 2|\Gamma| \sin \theta$$

where $|\Gamma|$ is the magnitude of the reflection coefficient and is its phase.

* * * * *